United States Patent [19]
Dubin et al.

[11] Patent Number: 5,972,192
[45] Date of Patent: Oct. 26, 1999

[54] PULSE ELECTROPLATING COPPER OR COPPER ALLOYS

[75] Inventors: Valery Dubin, Cupertino; Chiu Ting, Saratoga; Robin W. Cheung, Cupertino, all of Calif.

[73] Assignee: Advanced Micro Devices, Inc., Sunnyvale, Calif.

[21] Appl. No.: 08/898,089

[22] Filed: Jul. 23, 1997

[51] Int. Cl.$^6$ .............................. C25D 5/18; H01L 21/445
[52] U.S. Cl. .................. 205/101; 205/103; 205/104; 205/123; 438/641
[58] Field of Search .................................... 205/101, 102, 205/103, 104, 75, 123; 438/641

[56] References Cited

U.S. PATENT DOCUMENTS

| | | | |
|---|---|---|---|
| 2,733,198 | 1/1956 | Nobel et al. | 205/297 |
| 2,842,488 | 7/1958 | Strauss et al. | 205/297 |
| 2,882,209 | 4/1959 | Brown et al. | 205/297 |
| 2,972,572 | 2/1961 | Cope, Jr. et al. | 205/298 |
| 4,073,699 | 2/1978 | Hutkin | 205/50 |
| 4,134,802 | 1/1979 | Herr | 205/260 |
| 4,396,467 | 8/1983 | Anthony | 205/103 |
| 4,445,978 | 5/1984 | Whartenby et al. | 205/123 |
| 4,514,265 | 4/1985 | Rao et al. | 205/105 |
| 4,555,315 | 11/1985 | Barbieri et al. | 205/296 |
| 4,574,095 | 3/1986 | Baum et al. | 427/584 |
| 4,662,788 | 9/1997 | Sandhu et al. | 205/87 |
| 4,666,567 | 5/1987 | Loch | 205/83 |
| 4,789,648 | 12/1988 | Chow et al. | 438/633 |
| 5,093,279 | 3/1992 | Andreshak et al. | 438/662 |
| 5,240,497 | 8/1993 | Shacham et al. | 106/1.26 |
| 5,252,196 | 10/1993 | Sonnenberg et al. | 205/296 |
| 5,262,354 | 11/1993 | Cote et al. | 216/18 |
| 5,280,154 | 1/1994 | Cuomo et al. | 219/121.52 |
| 5,409,587 | 4/1995 | Sandhu et al. | 204/192.12 |

OTHER PUBLICATIONS

John A. Mock, "On–Off plating puts down dense, fine–grained finishes", ME, Sep. 1978, pp. 76–78.

George W. Jernstedt, "Better Deposits At Greater Speeds By P R Plating", reprinted from Plating, Jul. 1948.

Kaanta et al., "Dual Damascene: A ULSI Wiring Technology," VMIC Conference, Jun. 11–12,1991, pp. 144–152.

Kenney et al., "A Buried–Plate Trench Cell for a 64–Mb DRAM," Symposium on VLSI Technology Digest of Technical Papers, 1992, *pp. 14–15.

Joshi, "A New Damascence Structure for Submicrometer Interconnect Wiring," IEEE Electron Device Letters, vol. 14, No. 3, Mar. 1993, pp. 129–132.

Hopwood et al., "Mechanisms for highly ionized magnetron sputtering," Journal of Applied Physics, vol. 78, No. 2, Jul. 1995, pp. 758–765.

Rossnagel et al., "Metal ion deposition from ionized mangetron sputtering discharge," Journal of the American Vacuum Society, Jan./Feb. 1994, pp. 449–453.

Ting et al., "Selective Electroless Metal Deposition for Via Hole Filling in VLSI Multilevel Interconnection Structures," Journal of the Electrochemical Society, vol. 136, No. 2, Feb. 1989, pp. 462–466.

Ting et al., "Selective Electroless Metal Deposition for Integrated Circuit," Journal of the Electrochemical Society, vol. 136, No. 2, Feb. 1989, pp. 456–462.

*Primary Examiner*—Donald R. Valentine
*Assistant Examiner*—William T. Leader

[57] ABSTRACT

High aspect ratio openings in excess of 3, such as trenches, via holes or contact holes, in a dielectric layer are voidlessly filled employing a pulse or forward-reverse pulse electroplating technique to deposit copper or a copper-base alloy. A leveling agent is incorporated in the electroplating composition to ensure that the opening is filled substantially sequentially from the bottom upwardly.

16 Claims, No Drawings

PULSE ELECTROPLATING COPPER OR COPPER ALLOYS

TECHNICAL FIELD

The present invention relates to a method of filling an opening in a dielectric layer by electroplating copper or a copper alloy therein. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology, which is considered one of the most demanding aspects of ultra large scale integration technology. Such escalating requirements have been found difficult to satisfy in terms of providing a low RC (resistance capacitance) interconnect pattern, particularly wherein submicron vias, contacts and trenches have high aspect ratios due to miniaturization.

Conventional semiconductor devices comprise a semiconductor substrate, normally of monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines formed in trench openings typically extend substantially horizontal with respect to the semiconductor substrate. Semiconductor "chips" comprising four or more levels of metallization are becoming more prevalent as device geometries shrink to submicron levels.

A conductive plug filling a via opening is typically formed by depositing a dielectric interlayer on a conductive layer comprising at least one conductive pattern, forming an opening through the dielectric interlayer by conventional photolithographic and etching techniques, and filling the opening with a conductive material, such as tungsten (W). Excess conductive material on the surface of the dielectric interlayer can be removed by chemical-mechanical polishing. One such method is known as damascene and basically involves the formation of an opening which is filled in with a metal. Dual damascene techniques involve the formation of an opening comprising a lower contact or via opening section in communication with an upper trench opening section, which opening is filled with a conductive material, typically a metal, to simultaneously form a conductive plug in electrical contact with a conductive line. In copending application Ser. No. 08/320,516 filed on Oct. 11, 1994, now U.S. Pat. No. 5,635,423, prior art single and dual damascene techniques are disclosed, in addition to several improved dual damascene techniques simultaneously forming a conductive line in electrical contact with a conductive plug for greater accuracy in forming fine line patterns with minimal interwiring spacings.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Thus, the interconnection pattern limits the speed of the integrated circuit.

If the interconnection node is routed over a considerable distance, e.g., hundreds of microns or more, as in submicron technologies, the interconnection capacitance limits the circuit node capacitance loading and, hence, the circuit speed. As integration density increases and feature size decreases in accordance with submicron design rules, the rejection rate due to integrated circuit speed delays approaches and even exceeds 20%.

One way to increase the control speed of semiconductor circuitry is to reduce the resistance of a conductive pattern. Conventional metallization patterns are typically formed by depositing a layer of conductive material, notably aluminum (Al) or an alloy thereof, and etching, or by damascene techniques wherein trenches are formed in dielectric layers and filled with a conductive material. Excess conductive material on the surface of the dielectric layer is then removed by chemical-mechanical polishing. Al is conventionally employed because it is relatively inexpensive, exhibits low resistivity and is relatively easy to etch. However, as the size of openings for vias/contacts and trenches is scaled down to the sub-micron range, step coverage problems have arisen involving the use of Al which has decreased the reliability of interconnections formed between different wiring layers. Such poor step coverage results in high current density and enhanced electromigration. Moreover, low dielectric constant polyimide materials, when employed as dielectric interlayers, create moisture/bias reliability problems when in contact with Al.

One approach to improved interconnection paths in vias comprises the use of completely filled plugs of a metal, such as W. Accordingly, many current semiconductor devices utilizing VLSI (very large scale integration) technology employ Al for a wiring metal and W plugs for interconnections at different levels. However, the use W is attendant with several disadvantages. For example, most W processes are complex and expensive. Moreover, W has a high resistivity. The Joule heating may enhance electromigration of adjacent Al wiring. Furthermore, W plugs are susceptible to void formation and the interface with the wiring layer usually results in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Copper (Cu) and Cu alloys have recently received considerable attention as a replacement material for Al in VLSI interconnect metallizations. Cu exhibits superior electromigration properties and has a lower resistivity than Al. In addition, Cu has improved electrical properties vis-à-vis W, making Cu a desirable metal for use as a conductive plug as well as conductive wiring. However, there are also disadvantages attendant upon the use of Cu. For example, Cu metallization is very difficult to etch. Moreover, Cu readily diffuses through silicon dioxide, the typical dielectric interlayer material employed in the manufacture of semiconductor devices, and adversely affects the devices.

One conventional approach in attempting to form Cu plugs and wiring comprises the use of damascene structures employing chemical mechanical polishing, as in Chow et al., U.S. Pat. No. 4,789,648. However, due to Cu diffusion through dielectric interlayer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium tungsten (TiW), and silicon nitride ($Si_3N_4$) for encapsulating Cu. The use of such barrier materials to encapsulate Cu is not limited to the interface between Cu and the dielectric interlayer, but includes interfaces with other metals as well.

Electroless deposition has been suggested as a technique for forming interconnect structures. See, for example, "Electroless Cu for VLSI," Cho et al., MRS Bulletin, June 1993, pp. 31–38; "Selective Electroless Metal Deposition For Integrated Circuit Fabrication," Ting et al., J. Electrochem. Soc., 136, 1989, p. 456 et seq.; "Selective Electroless Metal Deposition For Via Hole Filling in VLSI Multilevel Interconnection Structures," Ting et al., J. Electrochem. Soc., 136, 1989, p. 462 et seq.; and Shacham et al., U.S. Pat. No. 5,240,497.

Electroless Cu deposition is attractive due to low processing costs and high quality Cu deposits. In addition, equipment for performing electroless metal deposition is relatively inexpensive vis-à-vis other semiconductor processing equipment for depositing metals. Electroless deposition also offers the advantageous opportunity for batch processing of wafers, thereby further reducing the cost of electroless deposition and increasing production throughput. However, electroless deposition requires a catalytic surface, i.e., seed layer, for the autocatalytic action to occur. See, for example, Baum et al., U.S. Pat. No. 4,574,095 and "Electroless Copper Deposition on Metals and Silicides," Mak, MRS Bulletin, August 1994, pp. 55–62. It is difficult to obtain reliable and reproducible electroless Cu deposition, since the seed layer surface must maintain catalytic activity for effective electroless deposition of Cu.

Copending application Ser. No. 08/587,264, filed Jan. 16, 1996, now U.S. Pat. No. 5,824,599, discloses a method of electrolessly depositing Cu in an interconnect structure, which method comprises initially depositing a barrier layer in an opening, depositing a catalytic seed layer, preferably of Cu, on the barrier layer, and then depositing a protective layer the catalytic layer encapsulating and protecting the catalytic layer from oxidation. The preferred protective material is Al which forms an Al-Cu alloy at the interface of the catalytic and protective layers, thereby encapsulating the underlying Cu. Subsequently, Cu is electrolessly deposited from an electroless deposition solution which dissolves the overlying protective alloy layer to expose the underlying catalytic Cu layer.

As the aspect ratio of openings for trenches, contacts and vias for interconnect patterns approaches 2:1 and greater, e.g., greater than 3:1, it becomes increasingly more challenging to voidlessly fill such openings employing conventional technology, such as magnetron sputtering techniques involving either direct current or radio frequency sputtering. Conventional attempts to improve sputtering capabilities comprise the use of a collimator as in Sandhu et al., U.S. Pat. No. 5,409,587.

A more recent approach in the evolution of high aspect ratio contact/via interconnection technology involves the ionization of sputtered metals by a high density plasma. See S. M. Rossnagel et al., "Metal ion deposition from ionized magnetron sputtering discharge,"J. Vac. Sci. Technol. B 12(1), January/Febuary 1994, pp. 449–453 and J. Hopwood et al., "Mechanisms for highly ionized magnetron sputtering," J. Appl. Phys., Vol. 78, No. 2, Jul. 15, 1995, pp. 758–765. Further attempts to improve RF induced plasma processing by generating a greater percent of ionized sputtered material employing a coil having a generally flattened surface defined by parallel conductors is disclosed by Cuomo et al., U.S. Pat. No. 5,280,154.

Although electroless deposition and electroplating offer the prospect of low cost, high throughput, high quality plated films and efficient via, contact and trench filling capabilities, the requirement for a catalytic seed layer becomes problematic, particularly in filling high aspect ratio openings. Electroless plating generally involves the controlled autocatalytic deposition of a continuous film on the catalytic surface by the interaction in solution of a metal salt and a chemical reducing agent. Electroplating comprises the electrodeposition of an adherent metallic coating on an electrode employing externally supplied electrons to reduce metal ions in the plating solution. A seed layer is required to catalyze electroless deposition or to carry electrical current for electroplating. For electroplating, the seed layer must be continuous. However, for electroless plating, very thin catalytic layers, e.g., less than 100 Å, can be employed in the form of islets of catalytic metal.

In copending application Ser. No. 08/857,129 filed on May 15, 1997 (Our Docket No. 1033-226/150100-301, a method of electroless plating or electroplating copper or a copper alloy to fill high aspect ratio openings is disclosed, wherein a seed layer comprising an alloy of a refractory metal and one or more additive metals is initially deposited.

There is a continuing need for improvements in electroplating Cu or Cu alloys, particularly in voidlessly filling high aspect ratio openings, e.g., aspect ratios greater than 3:1 and with improved uniformity. There is also a need to develop methods for electroplating copper and copper alloys to voidlessly fill high aspect ratio openings so that the deposited copper or copper alloy exhibits a large grain size for improved reliability and increased electromigration resistance.

DISCLOSURE OF THE INVENTION

An object of the present invention is a method of electroplating Cu or a Cu alloy to reliably fill openings in a dielectric layer, particularly high aspect ratio openings for contacts, vias and/or trenches.

According to the present invention, the foregoing and other objects are achieved in part by a method of filling an opening, having a lower end and an upper end, in a dielectric layer with Cu or a Cu alloy, which method comprises: pulse electroplating Cu or a Cu alloy from an electroplating composition comprising a leveling agent to fill the opening substantially sequentially from the lower end upwardly to the upper end.

Another aspect of the present invention comprises a method of filling an opening, having a lower end and an upper end, in a dielectric layer with Cu or a Cu alloy, which method comprises: forward-reverse pulse electroplating Cu or a Cu alloy from an electroplating composition comprising a leveling agent to fill the opening substantially sequentially from the lower end upwardly to the upper end.

A further aspect of the present invention comprises a method of filling an opening, having a lower end and an upper end, in a dielectric layer with copper or a Cu alloy, which method comprises cathodic deposition, such as DC, forward pulse or forward-reverse pulse, up to a thickness of Cu or Cu alloy which is about ½ of the opening (trench or via) width followed by anodic dissolution, as by DC, reverse pulse or reverse-forward pulse dissolution, to dissolve copper, especially in the corner of openings to have about the same or smaller Cu thickness at the corners of openings than that at the side walls of openings. Subsequently, vias or trenches will be filled by cathodic plating such as DC, forward-reverse or forward pulse plating.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the description is to be regarded as illustrative in nature, and not as restrictive.

DESCRIPTION OF THE INVENTION

The present invention addresses and solves reliability problems attendant upon conventional electroplating techniques to form high conductivity interconnect patterns by plating Cu or a Cu alloy to fill via, contact and/or trench openings in a dielectric interlayer. The solution embodied in the present invention is cost-effective, efficient and increases production throughput. Conventional Cu and Cu alloys electroplating techniques for filling high aspect ratio openings in a dielectric layer result in defects or voids in the filled openings, lack of uniformity and deposits exhibiting a small grain size. The present invention addresses such reliability problems by providing a method wherein high aspect ratio openings in a dielectric layer are filled voidlessly with improved uniformity and increased grain size, thereby improving reliability and increasing electromigration resistance. In accordance with the present invention, electroplating is conducted so that the opening is filled substantially sequentially from the bottom upwardly, thereby substantially eliminating voids while simultaneously enhancing uniformity and increasing the grain size of the deposited Cu or Cu alloy.

In an embodiment of the present invention, an opening in a dielectric layer is substantially voidlessly filled sequentially from the bottom upwardly by employing pulse electroplating and incorporating a leveling agent in the electroplating composition. Optionally, a brightening agent is incorporated in the electroplating composition for improved uniformity and decreased surface roughness.

In pulse electroplating, the thickness of the diffusion layer formed at the solution-electrode interface during plating is reduced, since Cu ions diffuse to the cathode surface while the current pulse is off. Pulse electroplating is generally employed in metal finishing industries and comprises, in its simplest sense, metal deposition by pulse electrolysis, as by interrupted DC current, to electroplate parts. This is effected with a series of pulses of DC current of equal amplitude and duration in the same direction, separated by periods of zero current. The pulse rate (frequency) and ON and OFF interval x (duty cycle) are controllable to optimize electro-deposition in a particular situation. Pulse electroplating can be conducted by utilizing a constant current or with constant voltage pulses. In employing pulse electroplating in accordance with the present invention, one having ordinary skill in the art could easily optimize the relevant variables, such as the duty cycle, frequency and current density in a particular situation.

In accordance with the present invention, a leveling agent is incorporated in the electroplating composition and periodically replenished as necessary, to ensure that an opening, particularly a high aspect ratio opening, e.g., greater than 3:1, is reliably voidlessly filled commencing at the bottom and progressing sequentially to the top of the opening, with improved uniformity and increased grain size. Leveling agents have been incorporated in electroplating baths for improved uniformity of deposition, along with brightening agents, as when electroplating a metal onto an irregular surface. See, for example, Sonnenberg et al., U.S. Pat. No. 5,252,196 wherein an electroplating method is disclosed wherein the amounts of brightening and leveling agents are limited in plating through holes in a printed circuit board.

Leveling agents are well known and, hence, need not be described herein in great detail. Leveling agents which can be employed in the present invention include any of those employed in the electroplating art, such as polyamines, polyamides and polyimides. Leveling agents for use in the present invention include polyethyleneimine, polyglycine, 2-amino-1-naphthalenesulfonic acid, 3-amino-1-propanesulfonic acid, 4-aminotoluene-2-sulfonic acid, as well as those disclosed by Sonnenberg et al., as well as those disclosed in U.S. Pat. No. 4,555,315 to Barbieri, U.S. Pat. No. 2,972,572 to Cope et al., U.S. Pat. No. 2,882,209 to Brown, U.S. Pat. No. 2,842,488 to Strauss et al. and U.S. Pat. No. 2,733,198 to Nobel et al., the entire disclosures of which are hereby incorporated herein by reference.

In another embodiment of the present invention, forward-reverse pulse plating is employed to electroplate Cu or a Cu alloy in substantially voidlessly filling a high aspect ratio opening from an electroplating solution containing a leveling agent. An optional brightening agent can also be incorporated in the electroplating composition for improved uniformity.

In forward-reverse pulse plating, the current pulses in each direction an individually controlled as are the frequency and duration of the pulses. During forward-reverse pulse plating, Cu is continuously plated and deplated, with deplating occurring to a greater extent at locations where Cu is plated at a higher rate, thereby improving uniformity. However, the objective of substantially voidlessly filling a high aspect ratio opening in a dielectric layer by filling the opening by commencing deposition at the bottom and progressing upwardly to the top of the opening was surprisingly achieved by incorporating a leveling agent in the electroplating composition. It was found that upon incorporating a leveling agent in the electroplating solution, Cu commenced plating at the bottom of the opening and progressed substantially sequentially to the top of the opening, resulting in seam-free fillings. It was also found that the deposited Cu or Cu alloys exhibited enhanced uniformity and a significantly increased grain size. In fact, experimental testing confirmed that high aspect ratio openings were filled with Cu having a thickness not exceeding the thickness of the deposited Cu layer. It was also confirmed by experimental testing that pulse electroplating Cu from a plating solution containing a leveling agent resulted in a filled high aspect ratio opening with a single grain of Cu or Cu alloy.

In another embodiment of the present invention, Cu and Cu alloys are electroplated from a solution containing a leveling agent to fill high aspect ratio openings employing two electroplating phases. During an initial electroplating phase, the Cu or Cu alloy is electroplated up to an initial thickness, such as up to about 1000 Å, employing DC plating or forward-pulse plating. During the second electroplating phase, the opening is completely filled employing forward-reverse pulse plating.

In another embodiment of the present invention, Cu and Cu alloys are electroplated from a solution containing a leveling agent to fill high aspect ratio openings by means of a process employing three or more electrochemical (deposition/etch) phases. During the first electroplating phase, Cu or a Cu alloy is electroplated to a thickness of about ½ of the opening (contact, via or trench) width, employing DC, forward-reverse or forward pulse plating. During the second electro-etching phase, the thickness of deposited copper is reduced by anodic dissolution by employing anodic DC or pulse dissolution to have about the same or smaller Cu thickness at the corners of openings than that on the side walls. During the third electroplating step, cathodic current is employed (DC, forward pulse or forward-reverse pulse) to fill the openings. This embodiment is particularly suitable to fill very high aspect ratio (>4) features such as vias, contacts or trenches, when a seam is more likely to be developed during fill process.

An improvement in uniformity can be achieved by incorporating a brightening agent in the electroplating solution. As brightening agents are conventional, they are not discussed herein in great detail. Brightening agents suitable for use in the present invention can be any of those disclosed by Sonnenberg et al.

The precise mechanism underpinning the present invention whereby a high aspect ratio opening is filled from the bottom progressively upwardly is not known. However, while not wishing to be bound by any particular theory, it is believed that, as a result of diffusion, a smaller concentration of the leveling agent is established at the bottom of the opening, resulting in a relatively high deposition rate at the bottom of the opening which deposition rate decreases upwardly, due to suppression of electrodeposition by the increasing concentration of leveling agent. Pulse plating and/or forward-reverse plating enhances uniform deposition commencing at the bottom of the opening and progressing upwardly, yielding deposits exhibiting a larger grain size.

In carrying out the present invention, a seed layer and/or a barrier layer can also be preliminarily deposited. For example, a seed layer and/or barrier layer as disclosed in copending application Ser. No. 08/857,129 filed on May 15, 1997 (Our Docket No. 1033-226), the entire disclosure of which is hereby incorporated herein by reference, can be employed.

The present invention enjoys particular applicability in filling high aspect ratio openings, such as openings having an aspect ratio greater than 3:1 in a dielectric layer during manufacturing semiconductor devices to provide for contacts, vias and/or conductive lines filling trenches. Openings in a dielectric layer are typically formed by damascene techniques. Trenches are typically filled with a conductive material, such as a metal, to form a conductive line, while a via opening is typically filled with a conductive material to form an interconnection between different levels. Contact openings are typically filled with a conductive material to interconnect an upper metal layer with an underlying doped region or silicide region of a contact. Interconnect patterns are conventional and, hence, are not described herein in great detail.

The electroplating compositions employed in the present invention for electroplating Cu or a Cu alloy are conventional and, hence, not described herein in detail. It has been found particularly suitable to employ an electrodeposition solution comprising copper sulfate to supply $Cu^{2+}$ cations, $Cl^-$ anions to improve anode dissolution and sulfuric acid to increase the conductivity of the solution. A leveling agent, such as MLO™ manufactured by Enthone-OMI, Inc., New Haven, Conn., polyamines, polyamides and polyimides have been found particularly suitable for use in the present invention. Suitable brightening agents include MD™ manufactured by Enthone-OMI, Inc., New Haven, Conn. and 2,5 Dimercapto-1, 3, 4, thiodiazol.

EXAMPLE 1

A pair of trenches were formed in a dielectric layer by a damascene technique. The trenches had a diameter of about 0.25 $\mu$m and a diameter of about 0.4 $\mu$m, each having an aspect ratio greater than 3:1. Cu was electroplated to fill both trenches by employing unipolar (i.e., forward) pulse plating with a duty cycle of about 10% to about 90%, frequency of about 1 to about 1000 Hz and a current density of about 5 to about 50 mA/cm$^2$. The plating solution contained a brightener (MD™) and leveling agent (MLO™) at a concentration of 0.5 ml/1 to 30 ml/1 (MD) and 0.1 ml/1 to 15 ml/1 (MLO). The kinetics of the electroplating copper were observed after 20 seconds, 40 seconds and 80 seconds, confirming that electroplating occurred commencing at the bottom of each trench and progressed upwardly. Ion-beam imaging confirmed that both trenches were filled without defects and that a single Cu grain occupied the entirety of each trench.

EXAMPLE 2

Trenches having diameters of about 0.25 $\mu$m, about 0.5 $\mu$m and about 1 $\mu$m, each with an aspect ratio greater than 3:1, were formed in a dielectric layer by a damascene technique. Forward-reverse pulse plating of Cu was conducted under the following conditions:

cathodic pulse current density of about 5 MA/cm$^2$ to about 50 mA/cm$^2$ anodic pulse current density of about 3 mA/cm$^2$ to about 160 mA/cm$^2$ cathodic duty cycle of about 10% to about 90% anodic duty cycle of about 10% to about 90% cathodic pulse time of about 0.1 msec to about 150 m sec anodic pulse time of about 0.1 m sec to about 10 m sec.

Forward-reverse pulse plating was conducted using an electroplating composition containing a leveling agent (MLO™).

Separate electroplating compositions were prepared containing Isobrite-660 and Isobrite-672, leveling agents commercially marketed by MacDermid Inc.

SEM CS views and ion-beam imaging confirmed that in each case the trenches were voidlessly filled with Cu commencing at the bottom and progressed upwardly, with the deposits exhibiting large grains. Ion-beam imaging also confirmed that in each case the plated Cu exhibited high uniformity.

EXAMPLE 3

Example 1 was repeated, except that a two phase electroplating technique was employed. During the initial electroplating phase, Cu was deposited by conventional DC plating to a thickness of about 1000 Å employing a cathodic current density of about 5 to about 50 mA/cm$^2$. During the second forward-reverse phase, pulse plating was conducted under the conditions set forth in Example 2. It was found that the initial DC Cu plating increased the thickness of the Cu seed layer, especially at lower sidewalls of the openings prior to commencing pulse plating.

EXAMPLE 4

Example 2 was repeated except that plating was conducted in two phases. During the initial phase, a forward pulse plating technique was employed to deposit Cu to a thickness of about 1000 Å under the conditions set forth in Example 1. During the second phase, forward-reverse plating of Cu was conducted as set forth in Example 2. The results of Examples 3 and 4 were consistent with Examples 1 and 2.

The present invention enables substantially voidless filling of high aspect ratio openings in dielectric layers, which is particularly advantageous in the production of high speed integrated circuitry, particularly integrated circuitry having submicron design features. In manufacturing a semiconductor device in accordance with the present invention, conventional semiconductor substrates, such as monocrystalline silicon, and conventional dielectric layers, such as silicon dioxide layers, are formed in a conventional manner as by thermal oxidation of a deposited silicon layer, PECVD, thermal enhanced CVD, spin-on techniques, and from silicon dioxide derived from tetraethyl orthosilicate (TEOS).

Interconnect patterns formed in accordance with the present invention enjoy the advantages associated with Cu or Cu alloys for conductive paths in a semiconductor device. In carrying out the present invention, electroplating can be performed as a batch process in which a substantial number of wafers are immersed in a bath simultaneously.

The present invention provides cost-effective, efficient techniques for forming a reliable high conductivity interconnect pattern by pulse or forward-reverse pulse electroplating Cu or Cu alloy utilizing an electroplating composition containing a leveling agent. In electrodepositing Cu or Cu alloy in accordance with the present invention, seed layers and/or barrier layers can be employed. The amount of leveling agent employed in a particular situation can be optimized by one having ordinary skill in the art depending upon the exigencies of a particular situation, for example, the particular leveling agent and particular electroplating composition. It was generally found that the amount of leveling agent can be present in an amount less than 100 ppm to achieve the objectives of the present invention. Contact, via and trench openings filled by electroplating in accordance with the present invention are highly reliable, substantially defect free, uniform and exhibit a large grain size with improved resistance to electromigration.

In the previous descriptions, numerous specific details are set forth, such as specific materials, structures, chemicals, processes, etc., in order to provide a though understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and example of its versatility are shown and described in the present disclosure. It is to be understood that the invention is capable of use in various other combinations and environments and is capable of changes or modifications within the scope of the inventive concept as expressed herein.

What is claimed is:

1. A method of filling an opening in a dielectric layer forming part of an integrated circuit with copper or a copper alloy, the opening having a width and comprising lower and upper ends connected by a sidewall, with lower and upper corners formed at the respective intersections of the sidewall with the lower and upper ends, which method utilizes an electroplating composition and comprises the sequential steps of:

(a) in a first, electroplating phase, cathodically depositing the copper or copper alloy to partially fill the opening with a layer having a thickness corresponding to about one-half (½) of the width of the opening;

(b) in a second, electro-etching phase, anodically dissolving a portion of the deposited copper or copper alloy layer so that the remaining thickness of the deposited copper or copper alloy at the upper corners is the same as or less than at the sidewall; and (c) in a third, electroplating phase, substantially completely filling the opening by cathodic plating.

2. The method according to claim 1, wherein the electroplating composition comprises a leveling agent.

3. The method according to claim 2, wherein the eletroplating composition comprises less than about 100 ppm of the leveling agent.

4. The method according to claim 2, wherein the leveling agent comprises a polyamine, polyamide or polyimide.

5. The method according to claim 2, wherein the leveling agent is polyethyleneimine, polyglycine, 2-amino-1-naphthalenesulfonic acid, 3-amino-1-propanesulfonic acid or 4-aminotoluene-2-sulfonic acid.

6. The method according to claim 2, comprising periodically replenishing the leveling agent.

7. The method according to claim 1, wherein in at least one of the first, electroplating phase and the third, electroplating phase, the copper or copper alloy is forward pulse plated with a duty cycle of about 10 to about 90%, at a frequency of about 1 to about 1000 Hz and a current density of about 5 to about 50 mA/cm$^2$.

8. The method according to claim 1, wherein in at least one of the first, electroplating phase and the third, electroplating phase, the copper or copper alloy is forward-reverse pulse electroplated at a cathodic pulse current density from about 5 to about 50 mA/cm$^2$, an anodic pulse current density of about 3 to about 160 mA/cm$^2$, cathodic duty cycle of about 10 to about 90%, anodic duty cycle of about 10 to about 90%, cathodic pulse time of about 0.1 msec to about 150 msec, and an anodic pulse time of about 0.1 msec to about 10 msec.

9. The method according to claim 1, comprising:

forward pulse plating copper or copper alloy during said first, electroplating phase, to a thickness up to about 1000 Å; and subsequently forward-reverse pulse electroplating the copper or copper alloy during said second, electroplating phase, to fill the opening.

10. The method according to claim 1, comprising filling the opening so that the grain size of the deposited copper or copper alloy is not greater than the thickness of the deposited copper or copper alloy.

11. The method according to claim 1, comprising filling the opening so that only one grain of copper or copper alloy occupies the opening.

12. A method of manufacturing an intergrated circuit semiconductor device, which method comprises filling an opening for a trench, via and/or contact in a dielectric layer by the method according to claim 1.

13. The method according to claim 1, comprising filling an opening having an aspect ratio greater than 3:1.

14. The method according to claim 1, wherein the electroplating composition further comprises a brightening agent.

15. The method according to claim 1 wherein the electroplating phases are conducted by forward pulse or forward-reverse pulse plating, and the electro-etching phase is conducted by DC or pulse dissolution.

16. The method according to claim 1, wherein the opening has an aspect ratio greater than 4:1.

* * * * *